(12) United States Patent
Geboff

(10) Patent No.: US 12,732,194 B2
(45) Date of Patent: Sep. 8, 2026

(54) OUTPUT SWITCH MATRIX TO REALLOCATE PHASES ACROSS INDEPENDENT VOLTAGE RAILS

(71) Applicant: NVIDIA Corporation, Santa Clara, CA (US)

(72) Inventor: Adam Geboff, Campbell, CA (US)

(73) Assignee: NVIDIA Corporation, Santa Clara, CA (US)

( * ) Notice: Subject to any disclaimer, the term of this patent is extended or adjusted under 35 U.S.C. 154(b) by 222 days.

(21) Appl. No.: 18/536,036

(22) Filed: Dec. 11, 2023

(65) Prior Publication Data

US 2025/0192786 A1 Jun. 12, 2025

(51) Int. Cl.
*H03K 19/17772* (2020.01)
*H02M 1/00* (2006.01)
*H03K 19/17728* (2020.01)
*H03K 19/17736* (2020.01)

(52) U.S. Cl.
CPC .... *H03K 19/17772* (2013.01); *H02M 1/0083* (2021.05); *H03K 19/17728* (2013.01); *H03K 19/1774* (2013.01)

(58) Field of Classification Search
CPC ....... H03K 19/17772; H03K 19/17728; H03K 19/1774; H02M 1/009; H02M 1/0083; H02M 3/1584
See application file for complete search history.

(56) References Cited

FOREIGN PATENT DOCUMENTS

CN 117937931 A * 4/2024 ............ H02M 1/088

* cited by examiner

*Primary Examiner* — Crystal L Hammond
*Assistant Examiner* — Jonathan Walter Soileau
(74) *Attorney, Agent, or Firm* — Lowenstein Sandler LLP

(57) ABSTRACT

Technologies directed to allocating and reallocating phases across independent voltage rails for multiple circuits are described. A multi-phase voltage regulator (VR) module with multiple output rails can include multiple VR controllers, multiple phases, an output switch matrix, and phase allocation logic. The phase allocation logic, using the output switch matrix, can selectively allocate and reallocate any combination of the multiple phases to one of the multiple VR controllers to provide an output power on one of the multiple output rails.

22 Claims, 6 Drawing Sheets

RECEIVE, FROM A FIRST VOLTAGE REGULATOR (VR) CONTROLLER, A FIRST REQUEST ASSOCIATED WITH A FIRST PHASE ALLOCATION FOR A FIRST OUTPUT RAIL 602

IDENTIFY A FIRST SUBSET OF ONE OR MORE PHASES FROM A PLURALITY OF PHASES TO ALLOCATE TO THE FIRST OUTPUT RAIL FOR THE FIRST PHASE ALLOCATION 604

CONTROL AN INPUT MULTIPLEXER OF EACH PHASE OF THE FIRST SUBSET TO COUPLE TO THE FIRST VR CONTROLLER ACCORDING TO THE FIRST PHASE ALLOCATION 606

CONTROL AN OUTPUT SWITCH MATRIX TO COUPLE THE FIRST SUBSET TO THE FIRST OUTPUT RAIL ACCORDING TO THE FIRST PHASE ALLOCATION 608

FIG. 6

OUTPUT SWITCH MATRIX TO REALLOCATE PHASES ACROSS INDEPENDENT VOLTAGE RAILS

TECHNICAL FIELD

At least one embodiment pertains to providing power to circuits. For example, at least one embodiment pertains to technology for allocating and reallocating phases across independent voltage rails for multiple circuits.

BACKGROUND

The amount of power an integrated circuit, such as a System on Chip (SoC) or a graphics processing unit (GPU), can consume is independent of the amount of power a platform can source. A platform can provide multiple voltage rails for different circuits. Each voltage rail is designed independently using one or more phases, and the power requirement of the voltage rail drives the number of unique phases and their corresponding size. The number of rails can be increased to improve power efficiency. As the number of rails increases to improve power efficiency, the number of phases needed on the platform increases since each processing core still has very large peak currents. However, because of the platform's input current limiter (ICL) limits, only a small percentage of those phases will be active at any given time.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 6 is a flow diagram of a method for allocating phases using an output switch matrix according to at least one embodiment.

DETAILED DESCRIPTION

Figure 1:
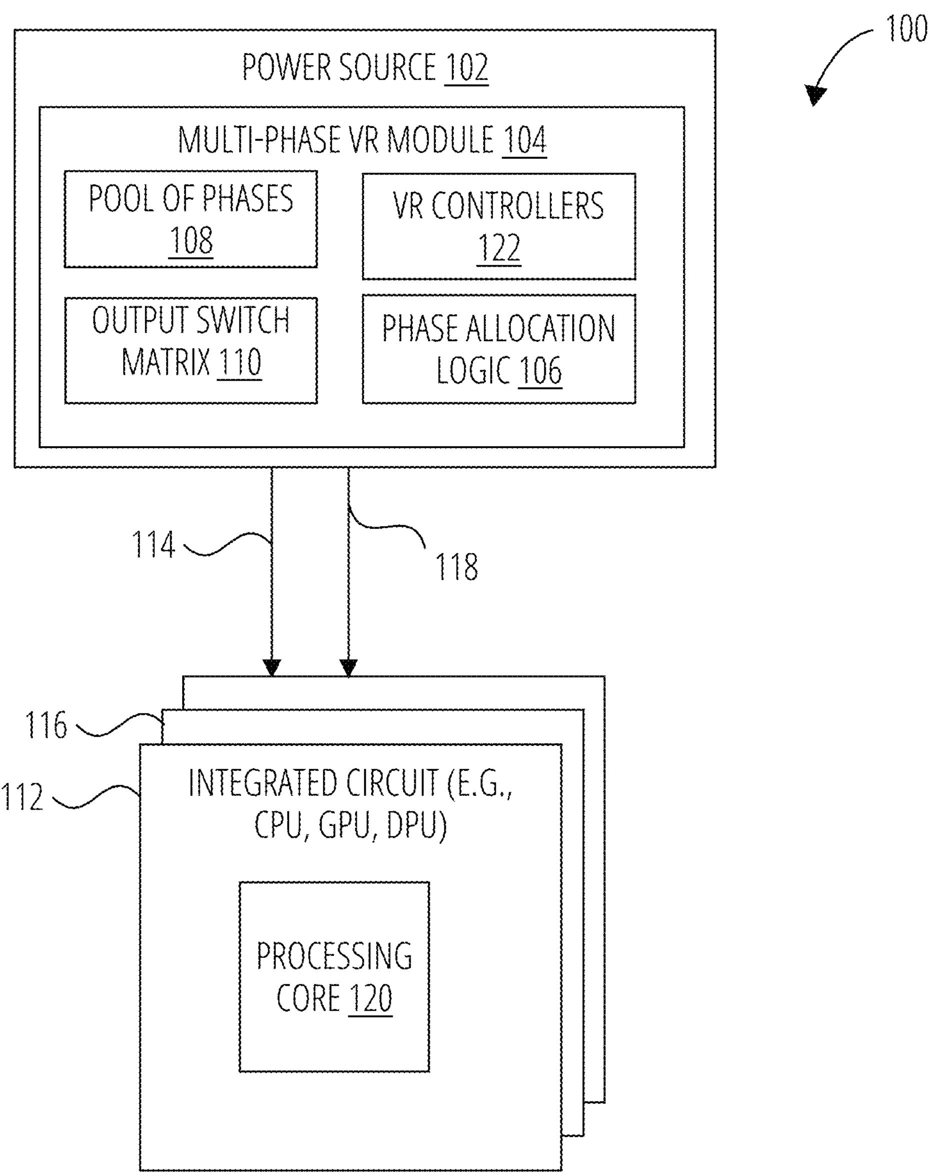
FIG. 1 is a block diagram of a platform with a power source with a phase allocation logic, a pool of phases, multiple voltage regulator (VR) controllers, and an output switch matrix for providing multiple rails to multiple circuits according to at least one embodiment.

Technologies for reallocating phases across independent voltage rails for multiple circuits are described. A rail voltage typically refers to a stable and fixed voltage level used as a reference or power supply voltage in electronic circuits. The rail voltage can serve as a stable supply voltage, such as a voltage drain-to-drain (VDD). The VDD is a voltage reference for the supply voltage in electronic circuits, especially digital circuits, where it is used to power the transistors or other active components of the circuit. VDD is commonly used in Complementary Metal-Oxide-Semiconductor (CMOS) digital circuits, which are widely used in microprocessors, a central processing unit (CPU), a graphics processing unit (GPU), or other processing cores, memory chips, or other digital devices. In these circuits, VDD represents the positive supply voltage that powers the circuit. Other voltage references can be used, such as voltage source-to-source (VSS), which represents the negative supply voltage. VDD can also be referred to as a rail voltage. In general, integrated circuits (ICs), microcontrollers, and other electronic components often require a stable supply voltage to operate correctly. Rail voltage provides this stable voltage level.

Voltage regulator (VR) circuits or power management ICs of a platform are used to maintain the rail voltage within a specified range, even in the presence of variations in the input voltage or load conditions. Complex electronic systems may have multiple rail voltages, each serving a specific purpose. For example, a computer motherboard may have separate rail voltages for a CPU, a GPU, memory, an SoC, and other components to meet their individual power requirements. The specific voltage level of a rail voltage can vary widely depending on the application. Common rail voltage levels include +5V, +3.3V, +12V, and −12V, among others. The choice of voltage level depends on the requirements of the circuit or device.

The VR circuits can be single-phase VRs or multi-phase VRs. A single-phase VR, also called a single-phase VR module, provides a single voltage regulation phase. Multi-phase VRs, also called multi-phase VR modules, can provide improved power delivery efficiency over single-phase VRs, reduced output voltage ripple, and improved thermal performance.

As described above, a conventional platform with increased phases to accommodate additional rail voltages for different circuits can suffer from power efficiency since each circuit can still have very large peak currents. Also, because of the ICL limits of the platform, only a small percentage of those phases will be active at any given time.

Aspects and embodiments of the present disclosure overcome the deficiencies described above and others by providing phase allocation logic to allocate and reallocate phases from a pool of phases to different output rails using an output switch matrix. By adding an output switch matrix between the phases and the voltage rails, the phase allocation logic can dynamically reallocate phases to the individual rails that require them. Conceptually, this can be similar to automatic phase shedding (APS). However, using the phase allocation logic, the phases are not constrained or fixed to a specific rail. Unlike the conventional VR circuits that have phases fixed to specific voltage rails in a fixed phase allocation, the phase allocation logic allows the phases to be a general platform resource that can be used for any of the voltage rails when needed. This can allow the multi-phase VR module to scale to a larger number of independent voltage rails without drastically increasing the number of phases required on the platform. This can save on cost and area (e.g., board area).

In at least one embodiment, a voltage regulator (VR) circuit can include a set of N output rails, where N is a positive integer greater than one, a set of N VR controllers, a set of M phases, where M is a positive integer greater than one, an output switch matrix, and supervisor logic. The output rail can also be referred to as a voltage rail, a power rail, or the like. An output rail can be implemented as an output terminal, an output pin, a connector, an output node, an internal node, a bus bar, a portion of a bus bar, or the like. It should also be noted that an output rail can include multiple terminals, multiple connectors, multiple nodes, or the like. Each phase of the set of M phases can include an N:1 input multiplexer and power components. The power components can regulate an output voltage and provide an output current. The output switch matrix is coupled to the set of M phases and the set of N output rails. The N:1 input multiplexer can couple the set of M phases to one of the set of N VR controllers. The supervisor logic can be coupled to the output switch matrix, the set of M phases, and the set of N VR controllers. Each VR controller can effectively use Automatic Phase Shedding (APS) to take or request phases from the pool of phases and release or give back the phases to the pool when not in use. The supervisor logic can selectively couple any one or more phases of the set of M phases to any one or more output rails of the set of N output rails. In some cases, there is one VR controller per output rail. That is, Nis equal to a number of output rails and the number of VR controllers. In other embodiments, there can be a different number of VR controllers than the number of output rails. In at least one embodiment, each phase needs an N:1 input multiplexer to select the correct VR controller, and a 1:N output multiplexer (output switch matrix) can be used to select the correct output rail for the selected VR controller. The supervisor logic can determine which of the M phases are connected to the VR controller and corresponding output rail. All phases can be independent and allocated or reallocated to any controller/output rail combination as needed or otherwise idle in the pool of phases.

The multi-phase VRs can employ multiple phases working in parallel. Each phase can include a combination of power components (e.g., inductors, capacitors, transistors) that collectively regulate an output voltage. By splitting a load across multiple phases, each phase can handle a portion of the load current. This reduces the load on individual components, resulting in less power dissipation and improved overall efficiency. Higher efficiency means less wasted energy, reduced heat generation, and longer component lifespan. Multi-phase VRs can significantly reduce output voltage ripple, which is the variation in the output voltage due to switching or load changes. Each phase operates out of phase with the others, effectively smoothing out the output voltage waveform. This helps maintain a stable and clean power supply. Multi-phase VRs offer faster transient response compared to single-phase VRs. Multi-phase VRs can quickly respond to sudden changes in load, ensuring that the output voltage remains within the desired range even during dynamic loads or transient events. Multi-phase VRs can handle higher output currents than single-phase VRs without the need for oversized and expensive components. This makes them suitable for high-power delivery applications, such as gaming graphics cards and high-end CPUs. Some multi-phase VRs can be programmable or have adaptive features, allowing for dynamic adjustment of phase count and other parameters to optimize power delivery based on the load and thermal conditions. Multi-phase VRs can provide precise voltage regulation, ensuring the output voltage remains stable and within the specified tolerance, even under varying load conditions. Multi-phase VRs can be located on different platforms, such as computer motherboards, graphics cards, or the like.

In at least one embodiment, the VR circuit may also include supervisor logic, where the supervisor logic, at a first time, can control one or more of the N:1 input multiplexers to couple a first VR controller of the set of N VR controllers to a first subset of one or more phases of the set of M phases according to a first phase allocation for a first output rail of the set of N output rails and control the output switch matrix to couple the first subset of phases to the first output rail according to the first phase allocation.

In at least one embodiment, the supervisor logic can track an availability status of each of the set of M phases, track a current phase allocation for each of the set of N VR controllers, and track a total output current provided by each of the set of N output rails or an output current provided by each of the set of M phases. The supervisor logic can track phase allocation, phase availability, current distribution, etc. In some embodiments, the supervisor logic can interact with a VR controller that can track the current per phase, efficiency for APS, or the like, and can request and release phases from the supervisor logic. In some cases, such as when all of the M phases have been allocated, the supervisor logic can manage efficiency of the phases and reallocate phases to balance across the multiple requesting VR controllers. In other embodiments, the supervisor logic or the VR controllers can track other telemetry data, such as total output current, phase current, or the like, and make allocation and reallocation determinations based on the telemetry data.

In at least one embodiment, the VR circuit may also include a first VR controller of the set of N VR controllers, where the first VR controller can allocate, at a first time, a first subset of one or more phases of the set of M phases, and the first VR controller can allocate, at a second time after the first time, a second subset of one or more phases of the set of M phases, where the first subset of phases and the second subset of phases are different.

In at least one embodiment, the VR circuit may also include a first VR controller and a second VR controller of the set of N VR controllers, where the first VR controller can allocate, at a first time, a first subset of one or more phases of the set of M phases, and the second VR controller can allocate, at a second time after the first time, a second subset of one or more phases of the set of M phases, where at least one phase is common to the first subset of phases and the second subset of phases.

In at least one embodiment, the VR circuit is an integrated circuit including the set of N output rails, the set of N VR controllers, the set of M phases, the output switch matrix, and the supervisor logic. In at least one embodiment, a first integrated circuit includes at least the set of N VR controllers and the set of M phases, and a second integrated circuit includes at least the output switch matrix.

In at least one embodiment, the VR circuit may also include a control bus coupled to a system controller, where the system controller includes the supervisor logic.

In at least one embodiment, the VR circuit may also include a second set of VR controllers, a second output switch matrix, a second set of phases, each phase of the second set of phases to provide an output current, where the second set of phases is coupled to the second output switch matrix, and second supervisor logic coupled to the second output switch matrix, the second set of phases, and the second set of VR controllers, where the second supervisor logic is to selectively couple any one or more phases of the second set of phases to any one or more output rails of the set of N output rails. For grouping multiple modules, each module would need its own set of controllers to control the respective set of phases. These controllers would need to work collaboratively through higher-level control and/or shared telemetry.

In at least one embodiment, the supervisor logic, at the first time, can control one or more of the N:1 input multiplexers to couple a second VR controller of the set of N VR controllers to a second subset of one or more phases of the set of M phases according to a second phase allocation for a second output rail of the set of N output rails and control the output switch matrix to couple the second subset of one or more phases to the second output rail according to the second phase allocation.

In at least one embodiment, the supervisor logic, at a second time after the first time, can control one or more of the N:1 input multiplexers to couple the first VR controller to a second subset of one or more phases of the set of M phases according to a second phase allocation for the first output rail and control the output switch matrix to couple the second subset of one or more phases to the first output rail according to the second phase allocation. An example platform with phase allocation logic is described below with respect to FIG. 1.

FIG. 1 is a block diagram of a platform 100 with a power source 102 with a phase allocation logic 106, a pool of phases 108, multiple VR controllers 122, and an output switch matrix 110 for providing multiple rails to multiple circuits according to at least one embodiment. The power source 102 can include a multi-phase VR module 104 with phase allocation logic 106, the pool of phases 108, the output switch matrix 110, and multiple VR controllers 122. The multi-phase VR module 104 can use multiple phases, from the pool of phases 108, the multiple phases working in parallel to provide an output power on one of the output rails. As described above, output rail can be implemented as an output terminal, an output pin, a connector, an output node, an internal node, a bus bar, a portion of a bus bar, or the like. It should also be noted that an output rail can include multiple terminals, multiple connectors, multiple nodes, or the like. Each phase can include a combination of power components (e.g., inductors, capacitors, transistors) that collectively regulate an output voltage and a portion of an output current. The output voltage and output current make up the output power (e.g., input power 114 or input power 118) provided by the multi-phase VR module 104. The multi-phase VR module 104 can provide input power to multiple circuits, such as illustrated with the power source 102 providing an input power 114 to an integrated circuit 112 and an input power 118 to an integrated circuit 116. It should be noted that the input power 114 and input power 118 are input power with respect to the integrated circuits 112 and 116 but can also be considered "output power" with respect to the multi-phase VR module 104. The integrated circuit 112 and integrated circuit 116 can each include a processing unit, a memory unit, a fixed-function unit, or the like. As illustrated in FIG. 1, the integrated circuit 112 includes a processing core 120. The processing core 120 can be a processor core of a central processing unit (CPU), a core of a graphics processing unit (GPU), a core of a data processing unit (DPU), or the like. The platform 100 can include other circuits, such as other processing units, as described herein. The multi-phase VR module 104 can provide input power 114 to the integrated circuit 112 and the input power 118 to the integrated circuit 116. The input power 114 can be provided rail power, including a specified rail voltage and a corresponding current based on a load by the integrated circuit 112. The platform 100 can include additional circuits that need different rail power, and the multi-phase VR module 104 can supply the different rail power to each of the circuits.

In at least one embodiment, the platform 100 includes processing units (e.g., 112, 116, or the like). The processing units can be a processor core of a CPU, a core of a GPU, a core of a DPU, a fixed-function unit, hardware-accelerated logic, or the like. The multi-phase VR module 104 can include multiple output rails, each output rail being coupled to one of the multiple processing units. The multi-phase VR module 104 can include multiple VR controllers 122 (e.g., multi-phase buck controller) coupled to the phase allocation logic 106, the pool of phases 108, and the output switch matrix 110. The phase allocation logic 106, using the output switch matrix 110, can selectively allocate and reallocate any combination of phases from the pool of phases 108 to one of the VR controllers 122 to provide an output power (e.g., input power 114 or input power 118) on one of the multiple output rails. It should be noted that in other embodiments, the platform 100 includes other circuits, such as an input/output (I/O) block (e.g., a high-speed I/O block), a deep learning accelerator (DLA), or the like. The platform 100 can be used for any high-current rail for any passive or active circuit that consumes a lot of current and requires multiple phase VRs.

In at least one embodiment, each phase of the pool of phases 108 can include an input multiplexer coupled to the VR controllers 122. The phase allocation logic 106 can control one or more input multiplexers to couple a first combination of phases from the pool of phases 108 to a first VR controller and control the output switch matrix 110 to couple the first combination of phases to a first output rail. The phase allocation logic 106 can allocate the first combination of phases between the first VR controller and the first output rail at a first time. At a second time, the phase allocation logic 106 can control one or more input multiplexers to couple a second combination of phases from the pool of phases 108 to the first VR controller and control the output switch matrix 110 to couple the second combination of phases to the first output rail. At a third time, the phase allocation logic 106 can control one or more input multiplexers to couple a third combination of phases from the pool of phases 108 to a second VR controller and control the output switch matrix 110 to couple the third combination of phases to a second output rail. At least one of the phases is common to the first combination and the third combination. That is, the phase allocation logic 106 can reallocate a phase to different combinations of phases to corresponding VR controllers 122 and output rails.

In at least one embodiment, each phase of the pool of phases 108 can include an input multiplexer to selectively couple to one of the VR controllers 122 and power components to provide a portion of an output current on one of the output rails via the output switch matrix 110. In at least one embodiment, the phase allocation logic 106 can track an availability status of each phase of the pool of phases 108, a current phase allocation for each of the VR controllers 122, and a total output current (or a total output power) provided by each of the output rails or an output current provided by each phase of the pool of phases 108.

Figure 3:
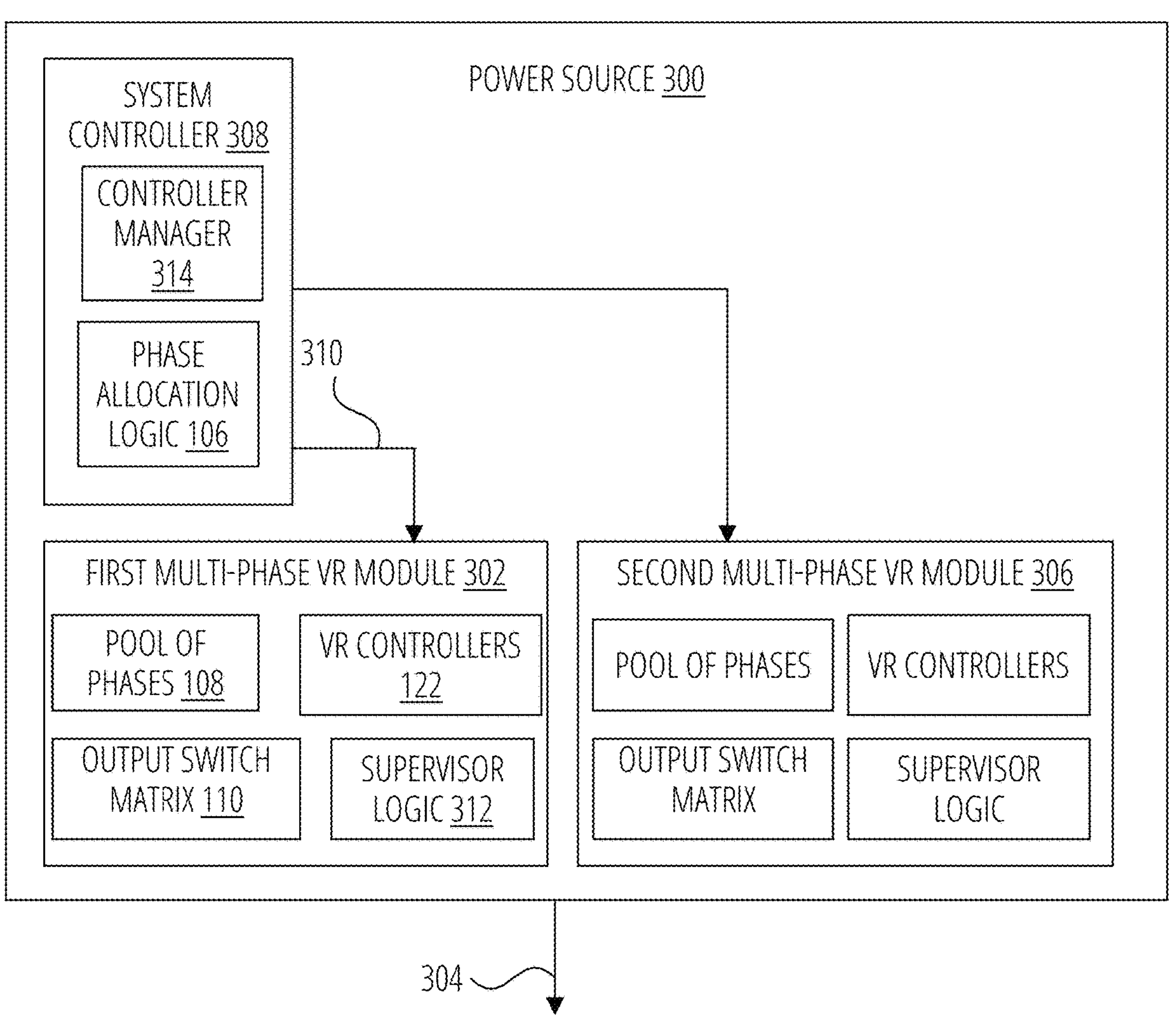
FIG. 3 is a block diagram of two multi-phase VR modules and a system controller for providing multiple rail voltages to multiple circuits according to at least one embodiment.

In at least one embodiment, the platform 100 includes a second multi-phase VR module (not illustrated in FIG. 1) coupled to the same or different output rails as the multi-phase VR module 104 and a system controller, as illustrated in FIG. 3.

Figure 2:
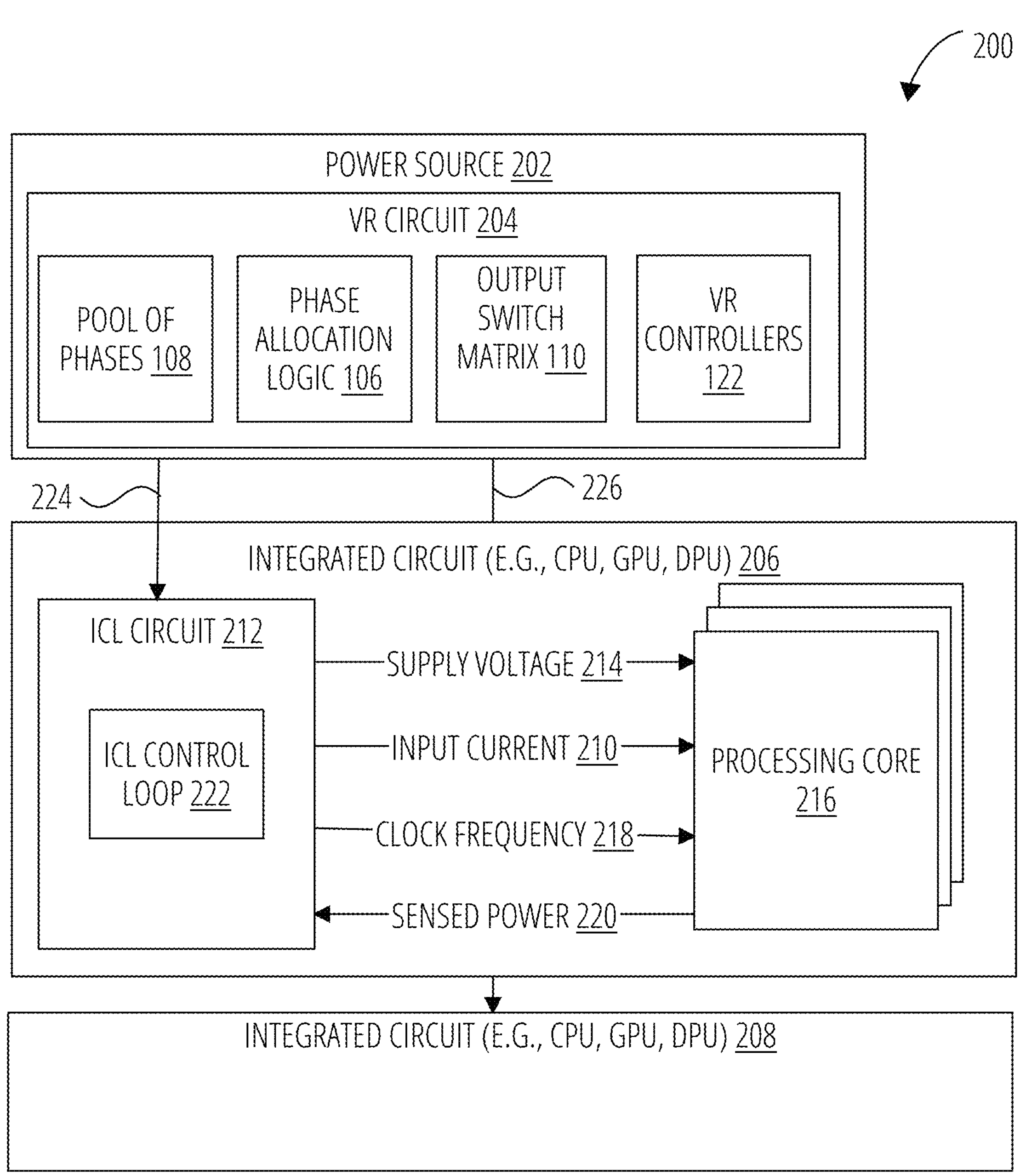
FIG. 2 is a block diagram of a platform with a power source with a VR circuit, including the phase allocation logic and the pool of phases, for providing multiple rail voltages to multiple circuits according to at least one embodiment.

FIG. 2 is a block diagram of a platform 200 with a power source 202 with a VR circuit 204, including the phase allocation logic 106 and the pool of phases 108, for providing multiple rail voltages to multiple circuits according to at least one embodiment. The platform 200 is similar to platform 100, as noted by similar reference numbers. The VR circuit 204 includes the phase allocation logic 106, pool of phases 108, and output switch matrix 110 as described above with respect to FIG. 1. The power source 202 can provide input power 224 to an ICL circuit 212 of the integrated circuit 206. The power source 202 can provide additional input power 226 to other circuits, such as the integrated circuit 208. The ICL circuit 212 can control power delivery to one or more processing cores 216 using an ICL control loop 222. The ICL circuit 212 is coupled to the processing core 216 and can provide a supply voltage 214 (e.g., rail voltage), an input current 210, and a clock frequency 218. The ICL circuit 212, using the ICL control loop 222, can reduce a clock frequency of the processing core 216 and a VR target voltage, referring to a voltage-frequency (VF) curve in what is called $CV^2F$ loading of the processing core 216. The ICL circuit 212 can use the ICL control loop 222 to limit the input current 210 provided to the processing core 216 within a first value representing a current limit of the processing core 216. The first value representing the current limit can be predefined or programmable. The first value can be stored in a register or other memory location. The ICL circuit 212 can receive or otherwise measure a sensed power 220 of the processing core 216, including a sensed voltage, a sensed current, a resistance, or other metrics of the processing core 216. The processing core 216 can include sensing circuitry (or a circuit board upon which the processing core 216 is located) that measures the actual current and voltage of the processing core 216 and reports the sensed power 220 to the ICL circuit 212. In at least one embodiment, voltage and current sensors can measure an output voltage and input current provided to processing core 216 and provide these measurements as feedback signals to the ICL circuit 212. These measurements can also be provided to the VR circuit 204. In various embodiments, the ICL circuit 212 limits input current and uses the sensed current as an input to the ICL control loop 222. The ICL circuit 212 can determine, from the sensed power 220, a second value representing the input current 210 of the processing core 216. The ICL circuit 212 can adjust the supply voltage 214, input current 210, and clock frequency 218, according to the sensed power 220. The ICL circuit 212 can include a look-up table (LUT) with frequency identifiers and voltage identifiers. The LUT, in response to receiving a frequency identifier, provides a voltage identifier corresponding to a specified voltage. The LUT can store V-F curve data. In this case, the input is the frequency identifier, and the output is a voltage identifier. In other cases, the input is the voltage identifier, and the output is the frequency identifier. The identifiers can be used by a VR block to provide power to the processing core 216.

In other embodiments, the power source 202 can include multiple multi-phase VR modules. An example of a power source with two multi-phase VR modules is described below with respect to FIG. 3.

FIG. 3 is a block diagram of a power source 300 with two multi-phase VR modules and a system controller 308 for providing multiple rail voltages to multiple circuits according to at least one embodiment. The power source 300 of FIG. 3 is similar to the power source 202 of FIG. 2, except the power source 300 includes a first multi-phase VR module 302, a second multi-phase VR module 306, and the system controller 308. Each VR controller 122 can have its own independent interface to the system controller 308 (e.g., SoC, EC, etc.). In other embodiments, each VR controller 122 can be managed by a higher-level supervisor as described herein, such as a controller manager 314 and the phase allocation logic 106. When the two or more VR modules are ganged together to provide larger rails, the controller manager 314 can manage the VR controllers to work in a coordinated manner. The controller manager 314 can track and/or share telemetry data with the VR modules so that the VR modules do not work against each other in a manner that is detrimental to another VR module. The controller manager 314 can manage the VR modules to connect to the appropriate output rails to form larger rails. The controller manager 314 and the phase allocation logic 106 (higher-level supervisor) can intelligently balance the load or thermals of the platform. Multiple supervisors can be used in parallel to extend a voltage output beyond M phases. This may require tighter coupling with the VR controller 122. The system controller 308 can be coupled to the first multi-phase VR module 302 and the second multi-phase VR module 306 via a control bus 310. The system controller 308 can include phase allocation logic 106 that operates similarly as described above, except the phase allocation logic 106 controls the first multi-phase VR module 302 and the second multi-phase VR module 306 via a control bus 310. The phase allocation logic 106 can receive requests and releases from the VR modules and/or the VR controllers within the VR modules. The phase allocation logic 106 can interact with the VR controllers 122 that track the current per phase, efficiency for APS, or the like, and request or release phases from the phase allocation logic 106 that coordinates with the supervisor logic 312 or the input multiplexers and output switch matrix 110 to connect the appropriate phases from the pool of phases 108 to the appropriate output rail. The phase allocation logic 106 can coordinate with supervisor logic 312 located in the first multi-phase VR module 302. In at least one embodiment, the phase allocation logic 106 can be higher-level logic that coordinates the supervisor logic 312 of the first multi-phase VR module 302 and the supervisor logic of the second multi-phase VR module 306. In another embodiment, the phase allocation logic 106 can be located in the first multi-phase VR module 302, and similar phase allocation logic can be located in the second multi-phase VR module 306. In another embodiment, the phase allocation logic 106 is located in the first multi-phase VR module 302, and higher-level logic can coordinate phase allocation logic at each of the multi-phase VR modules. The system controller 308, using the phase allocation logic 106, can control the first multi-phase VR module 302 and the second multi-phase VR module 306 to provide a combined output power 304 to any one or more of the processing units (not illustrated in FIG. 3). In another embodiment, the functionality of system controller 308, including the controller manager 314 and the phase allocation logic 106, can be implemented in one or more of the VR modules (e.g., 302 or 306). The supervisor logic (or phase allocation logic), pools of phases, and output switch matrixes in the two multi-phase VR modules can help scale a platform to provide additional combinations of phases for the rail voltages or additional rail voltages on the same or different output rails. That is, the higher-level logic can manage dynamic phase allocation and reallocation, by connecting any controller to any phase, and any phase to any output rail. Multiple VR modules can be stacked or otherwise implemented in one or more packages. In at least one embodiment, multiple packages can be stacked, and the VR controllers can be configured to collaborate across multiple packages. In at least one embodiment, a package can include multiple VR modules, each being a separate integrated circuit. When there are multiple VR modules, a high-speed bus interface can be used between the multiple VR modules.

For example, the high-speed bus interface can be a multi-drop bus interface. The high-level logic can aggregate input and output telemetry from the multiple VR modules to perform phase allocation and phase reallocation. In at least one embodiment, the VR modules are implemented as a power manager integrated circuit (PMIC). There can be multiple PMICs per output and/or multiple independent input voltages (Vins) per system (e.g., in a PCIe use case). The system power and VR controller limits can be set by an external controller, such as a System on Chip (SoC). The output voltage, total input power (e.g., ICL), output power control limits (OCLs) (per rail output power), or the like, can be set by the SoC. An example of a multi-phase VR module is described below with respect to FIG. 4.

Figure 4:
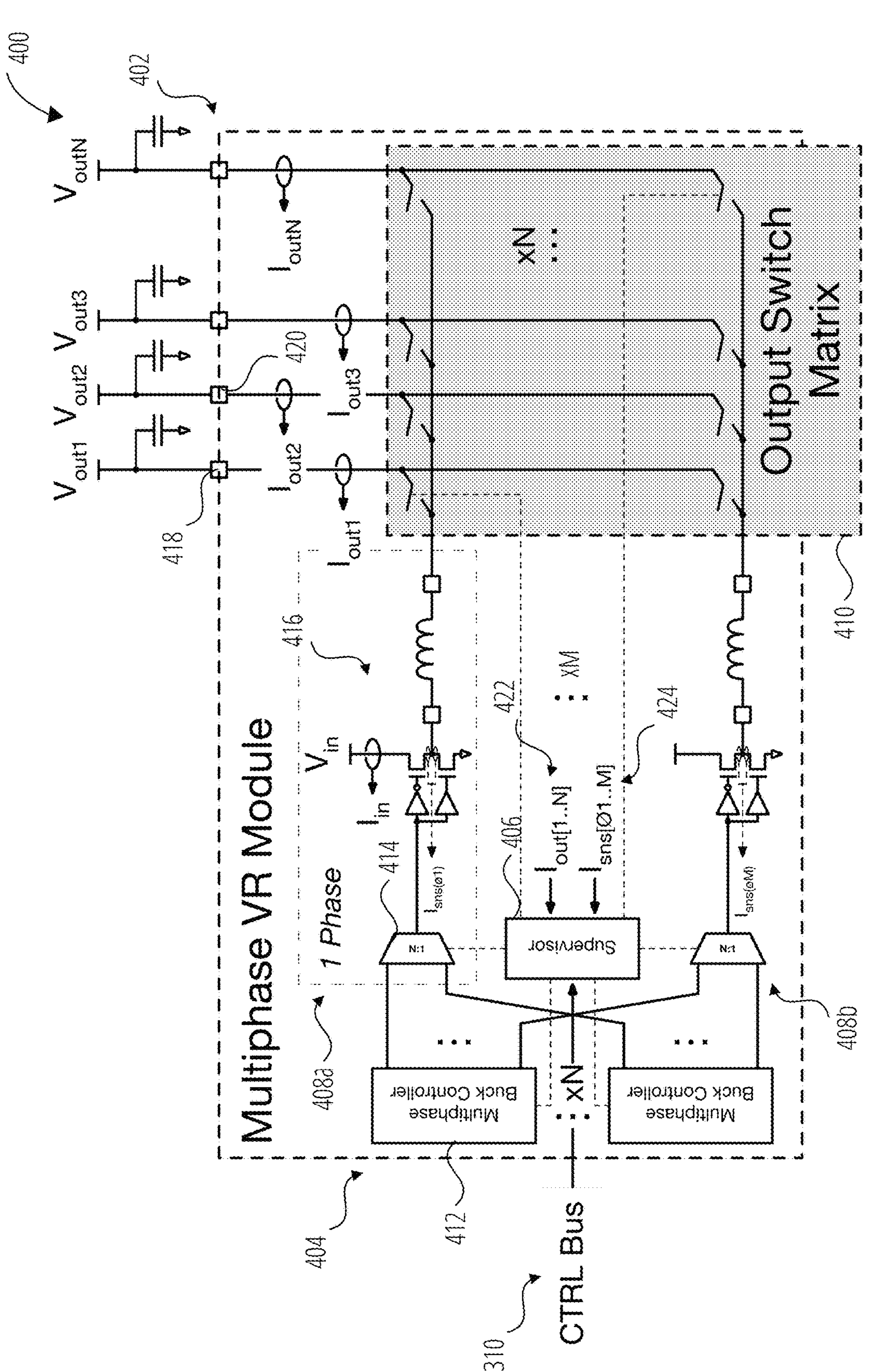
FIG. 4 is a circuit diagram of a multi-phase VR module with supervisor logic and an output switch matrix according to at least one embodiment.

FIG. 4 is a circuit diagram of a multi-phase VR module 400 with supervisor logic 406 and an output switch matrix according to at least one embodiment. The multi-phase VR module 400 includes a set of N output rails 402, a set of N VR controllers 404, a set of M phases 408*a*-408*b*, an output switch matrix 410, and the supervisor logic 406. The set of N VR controllers 404 can be similar to the VR controllers 122 described above. The supervisor logic 406 is coupled to the set of N VR controllers 404, the set of M phases 408*a*-408*b*, and the output switch matrix 410. Each output rail of the set of N output rails 402 is coupled to one of multiple processing units (not illustrated in FIG. 4). The processing units can be any of a processor core of a central processing unit (CPU), a core of a graphics processing unit (GPU), a core of a data processing unit (DPU), a switch, a processor, a microprocessor, a microcontroller, or the like.

In at least one embodiment, the supervisor logic 406 (or phase allocation logic), using the output switch matrix 410, can selectively allocate and reallocate any combination of the set of M phases 408*a*-408*b* to one of the set of N VR controllers 404 to provide an output power (Vout) on one of the set of N output rails 402. In at least one embodiment, the supervisor logic 406 can include a state machine or other decision logic to control the input multiplexers and the output switch matrix 410 to couple any VR controller set of N VR controllers 404 to any output rail of the set of N output rails 402. The set of N VR controllers 404 can each implement decision logic that can request allocation of a number of phases needed to meet a power requirement for a first output rail (e.g., output rail 418). The supervisor logic 406, in response, can control the input multiplexers and output switch matrix 410 to couple a combination of the set of M phases 408*a*-408*b* to the first output rail. A different VR controller can request allocation of a second combination of the set of M phases 408*a*-408*b* to meet a second power requirement for a second output rail. At a later time, a different combination of the set of M phases 408*a*-408*b* can be coupled to the first output rail. That is, the set of M phases 408*a*-408*b* can be reallocated in different combinations as described herein.

In at least one embodiment, each of the set of M phases 408*a*-408*b* includes an input multiplexer to selectively couple to one of the set of N VR controllers 404 and power components to provide a portion of an output current on one of the set of N output rails 402 via the output switch matrix 410. For example, a first phase 408*a* includes an input multiplexer 414 coupled to all N VR controllers 404 and power components 416 to provide a portion of output power (output current) on one of the output rails. The supervisor logic 406 can cause the input multiplexer 414 to selectively couple the first phase 408*a* to a first VR controller 412 (or any of the other VR controllers of the set of N VR controllers 404). In at least one embodiment, the first VR controller 412 is a multi-phase buck controller. In other embodiments, the VR controller can be any switched-mode power supply controller (e.g., a boost controller, a buck-boost controller, a flyback controller, a forward controller, or the like). The supervisor logic 406, at a first time, can control one or more of the input multiplexers to couple a first combination of the set of M phases 408*a*-408*b* to the first VR controller 412. At the first time, the supervisor logic 406 can control the output switch matrix 410 to couple the first combination of the set of M phases 408*a*-408*b* to an output rail 418 (e.g., Vout3). In this example, the first VR controller 412 is coupled to the output rail 418 via the output switch matrix 410 and the corresponding input multiplexers of the first combination. In at least one embodiment, at the first time, the supervisor logic 406 can control one or more of the input multiplexers to couple another combination of the set of M phases 408*a*-408*b* to a second VR controller. At the first time, the supervisor logic 406 can control the output switch matrix 410 to couple the other combination of the set of M phases 408*a*-408*b* to an output rail 420.

In at least one embodiment, at a second time, the supervisor logic 406 can control one or more of the input multiplexers to couple a second combination of the set of M phases 408*a*-408*b* to the first VR controller 412. At the second time, the supervisor logic 406 can control the output switch matrix 410 to couple the second combination of the set of M phases 408*a*-408*b* to the output rail 418.

In at least one embodiment, at a third time, the supervisor logic 406 can control one or more of the input multiplexers to couple a third combination of the set of M phases 408*a*-408*b* to a second VR controller. At least one of the set of M phases 408*a*-408*b* is common to the first combination and the third combination. At the third time, the supervisor logic 406 can control the output switch matrix 410 to couple the third combination to the output rail 420. Although FIG. 4 illustrates the output rail 418 and output rail 420 as being coupled to different combinations of phases, any output rail of the set of N output rails 402 can be coupled to any combination of M phases.

In at least one embodiment, the supervisor logic 406 can receive one or more control signals via the control bus 310. The supervisor logic 406 can receive the control signals from the phase allocation logic 106, as described above. In another embodiment, instead of supervisor logic 406, the multi-phase VR module 400 includes phase allocation logic 106 that controls the input multiplexers and the output switch matrix 410.

In at least one embodiment, the supervisor logic 406 (or the phase allocation logic) can track an availability status of each of the set of M phases 408*a*-408*b*, a current phase allocation for each of the set of N VR controllers 404, and a total output current provided by each of the set of N output rails 402 or an output current provided by each phase of the set of M phases 408*a*-408*b*. The supervisor logic 406 can receive the total output currents 422 ($I_{out[1 \ldots N]}$) and sensed currents 424 ($I_{sns[1 \ldots M]}$). The total output currents 422 are the currents provided on each of the set of N output rails 402, whereas the sensed currents 424 are the currents provided by each of the set of M phases 408*a*-408*b*. The currents can be measured in an analog domain and converted to digital values by an internal analog-to-digital converter (ADC) (not illustrated in FIG. 4). In at least one embodiment, each phase of the set of M phases 408*a*-408*b* can include an input multiplexer to selectively couple to one of the set of N VR controllers 404, and power components to provide a portion of an output current on one of the set of N output rails 402 via the output switch matrix 410.

As described above with respect to FIG. 3, a platform can include a second multi-phase VR module (e.g., 306) coupled to the same set of N output rails 402. A system controller can be coupled to the multi-phase VR module 400 and the second multi-phase VR module. The system controller can control the multi-phase VR module 400 and the second multi-phase VR module to provide a combined output power to a processing unit coupled to any one of the set of N output rails 402.

In at least one embodiment, the power components of the set of M phases 408*a*-408*b* can include a DrMOS device (short for Driver+MOSFET), an inductor, and an optional output capacitor (not illustrated in FIG. 4). A DrMOS device can combine multiple functions into a single integrated package, simplifying power delivery, improving efficiency, and reducing the overall size and complexity of the multi-phase VR module 400. Since each phase provides only a portion of the output current on one of the set of N output rails 402, the power components can be integrated within the integrated circuit rather than discrete components external to the integrated circuit. The multi-phase VR module 400 can include other types and configurations of power components, such as illustrated in FIG. 5.

Figure 5:
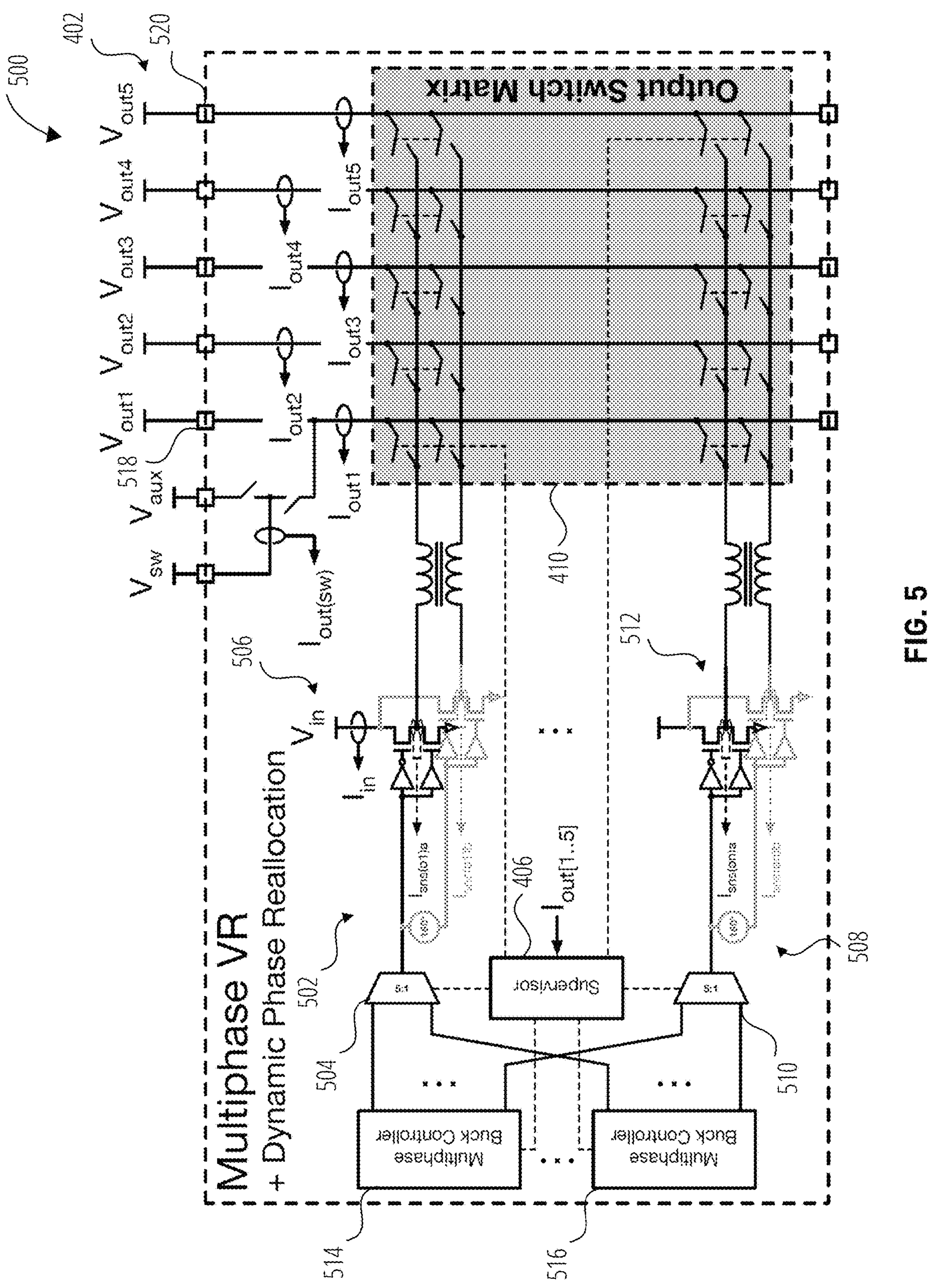
FIG. 5 is a circuit diagram of a multi-phase VR module with supervisor logic and an output switch matrix according to at least one embodiment.

FIG. 5 is a circuit diagram of a multi-phase VR module 500 with supervisor logic 406 and an output switch matrix 410 according to at least one embodiment. The multi-phase VR module 500 is similar to the multi-phase VR module 400, as noted by similar reference numbers. The multi-phase VR module 500 includes five phases, including a first phase 502 and a fifth phase 508. The first phase 502 includes a first input multiplexer 504 and power components 506. The fifth phase 508 includes a fifth input multiplexer 510 and power components 512. As illustrated in the example of FIG. 5, each input multiplexer can be a 5:1 multiplexer coupled to the five multi-phase buck controllers and the respective power components. The multi-phase VR module 500 includes five VR controllers, including a first multi-phase buck controller 514 and a fifth multi-phase buck controller 516. The five phases are coupled to the output switch matrix 410. The output switch matrix 410 is coupled to five output rails, including a first output rail 518 and a fifth output rail 520. The supervisor logic 406 is coupled to the five multi-phase buck controllers, the five input multiplexers, and the output switch matrix 410.

In at least one embodiment, the supervisor logic 406 (or the phase allocation logic) can selectively allocate any combination of the five phases to one the five multi-phase buck controllers to provide an output power on one of the five output rails.

In at least one embodiment, the supervisor logic 406, at a first time, can control a first set of input multiplexers, such as first input multiplexer 504 and fifth input multiplexer 510, to couple the first multi-phase buck controller 514 to a first combination of phases, such as the first phase 502 and fifth phase 508. The supervisor logic 406, at the first time, can control the output switch matrix 410 to couple the first phase 502 and the fifth phase 508 to the first output rail 518. The supervisor logic 406 can control any combination of phases to any of the five multi-phase buck controllers and any of the five output rails using the five input multiplexers and the output switch matrix 410.

In at least one embodiment, the supervisor logic 406, at a second time, can control one or more of the five input multiplexers to couple a second combination of the five phases to the first multi-phase buck controller 514. At the second time, the supervisor logic 406 can control the output switch matrix 410 to couple the second combination of the phases to the first output rail 518.

In at least one embodiment, the supervisor logic 406, at the first time, can control other input multiplexers to different combinations of the five phases to other multi-phase buck controllers and the output switch matrix 410 to couple the different combinations to other output rails.

In at least one embodiment, the supervisor logic 406, at a third time, can control one or more of the input multiplexers to couple a third combination of the phases to a second multi-phase buck controller. In at least one embodiment, at least one of the phases is common to the first combination and the third combination. At the third time, the supervisor logic 406 can control the output switch matrix 410 to couple the third combination to a second output rail, such as the fifth output rail 520.

In at least one embodiment, the supervisor logic 406 can receive the total output currents and/or the sensed currents, as described above.

FIG. 6 is a flow diagram of a method 600 for allocating phases using an output switch matrix according to at least one embodiment. The method 600 may be performed by processing logic that may comprise hardware (e.g., circuitry, dedicated logic, programmable logic, microcode, etc.), software (e.g., instructions run on a processing device to perform hardware simulation), or a combination thereof. In one embodiment, the method 600 is performed by the platform 100 of FIG. 1. In another embodiment, the method 600 is performed by the VR circuit 204 of FIG. 2. In another embodiment, the method 600 is performed by the phase allocation logic 106 of FIG. 1, FIG. 2, and FIG. 3. In another embodiment, the method 600 is performed by the supervisor logic 406 of FIG. 4 and FIG. 5.

Referring to FIG. 6, the method 600 begins by the processing logic receiving, from a first voltage regulator (VR) controller, a first request associated with a first phase allocation for a first output rail (block 602). At block 604, the processing logic identifies a first subset of one or more phases from a plurality of phases to allocate to the first output rail for the first phase allocation. At block 606, the processing logic controls an input multiplexer of each phase of the first subset to couple to the first VR controller according to the first phase allocation. At block 608, the processing logic controls an output switch matrix to couple the first subset to the first output rail according to the first phase allocation.

In a further embodiment, the processing logic receives, from the first VR controller, a second request associated with a second phase allocation for the first output rail. The processing logic can identify a second subset of one or more phases from the plurality of phases to allocate to the first output rail for the second phase allocation. The processing logic can control an input multiplexer of each phase of the second subset to couple to the first VR controller according to the second phase allocation. The processing logic can control the output switch matrix to couple the second subset to the first output rail according to the second phase allocation.

In a further embodiment, the processing logic receives, from a second VR controller, a second request associated with a second phase allocation for a second output rail. The processing logic can identify a second subset of one or more phases from the plurality of phases to allocate to the second output rail for the second phase allocation. The processing logic can control an input multiplexer of each phase of the second subset to couple to the second VR controller according to the second phase allocation. The processing logic can control the output switch matrix to couple the second subset to the second output rail according to the second phase allocation. In at least one embodiment, at least one phase is common to the first subset and the second subset. In at least one embodiment, the first subset and the second subset are different and do not include any common phases.

The techniques disclosed herein may be incorporated in any computing system that may be used for processing a neural network, such as, for example, a central processing unit (CPU), a GPU, an intelligence processing unit (IPU), neural processing unit (NPU), tensor processing unit (TPU), a neural network processor (NNP), a data processing unit (DPU), a vision processing unit (VPU), an application-specific integrated circuit (ASIC), a field-programmable gate array (FPGA), and the like. Such a processor may be incorporated in a personal computer (e.g., a laptop), at a data center, in an Internet of Things (IoT) device, a handheld device (e.g., smartphone), a vehicle, a robot, a voice-controlled device, or any other device that performs inference, training or any other processing of a neural network. Such a processor may be employed in a virtualized system such that an operating system executing in a virtual machine on the system can utilize the processor.

As an example, a processor incorporating the techniques disclosed herein can be employed to process one or more neural networks in a machine to identify, classify, manipulate, handle, operate, modify, or navigate around physical objects in the real world. For example, such a processor may be employed in an autonomous vehicle (e.g., an automobile, motorcycle, helicopter, drone, plane, boat, submarine, delivery robot, etc.) to move the vehicle through the real world. Additionally, such a processor may be employed in a robot at a factory to select components and assemble components into an assembly.

As an example, a processor incorporating the techniques disclosed herein can be employed to process one or more neural networks to identify one or more features in an image or alter, generate, or compress an image. For example, such a processor may be employed to enhance an image that is rendered using raster, ray-tracing (e.g., using NVIDIA RTX), and/or other rendering techniques. In another example, such a processor may be employed to reduce the amount of image data that is transmitted over a network (e.g., the Internet, a mobile telecommunications network, a wireless local area network, as well as any other wired or wireless networking system) from a rendering device to a display device. Such transmissions may be utilized to stream image data from a server or a data center in the cloud to a user device (e.g., a personal computer, video game console, smartphone, other mobile devices, etc.) to enhance services that stream images such as NVIDIA Geforce Now (GFN), Google Stadia, and the like.

As an example, a processor incorporating the techniques disclosed herein can be employed to process one or more neural networks for any other types of applications that can take advantage of a neural network. For example, such applications may involve translating languages, identifying, and negating sounds in audio, detecting anomalies or defects during the production of goods and services, surveillance of living beings and non-living things, medical diagnosis, making decisions, and the like.

Other variations are within the spirit of the present disclosure. Thus, while disclosed techniques are susceptible to various modifications and alternative constructions, certain illustrated embodiments are shown in drawings and described above in detail. It should be understood, however, that there is no intention to limit the disclosure to a specific form or forms disclosed, but on the contrary, the intention is to cover all modifications, alternative constructions, and equivalents falling within the spirit and scope of the disclosure, as defined in appended claims.

Use of the terms "a" and "an" and "the" and similar referents in the context of describing disclosed embodiments (especially in the context of following claims) is to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if something is intervening. Recitation of ranges of values herein is merely intended to serve as a shorthand method of referring individually to each separate value falling within the range, unless otherwise indicated herein. Each separate value is incorporated into the specification as if it were individually recited herein. In at least one embodiment, the use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but the subset and corresponding set may be equal.

Conjunctive language, such as phrases of the form "at least one of A, B, and C," or "at least one of A, B, and C," unless specifically stated otherwise or otherwise clearly contradicted by context, is otherwise understood with the context as used in general to present that an item, term, etc., may be either A or B or C, or any nonempty subset of the set of A and B and C. For instance, in an illustrative example of a set having three members, conjunctive phrases "at least one of A, B, and C" and "at least one of A, B, and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B, and at least one of C each to be present. In addition, unless otherwise noted or contradicted by context, the term "plurality" indicates a state of being plural (e.g., "a plurality of items" indicates multiple items). In at least one embodiment, the number of items in a plurality is at least two, but can be more when indicated either explicitly or by context. Further, unless stated otherwise or otherwise clear from context, the phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in the form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause a computer system to perform operations described herein. In at least one embodiment, a set of non-transitory computer-readable storage media comprises multiple non-transitory computer-readable storage media and one or more individual non-transitory storage media of multiple non-transitory computer-readable storage media lacks all of the code while multiple non-transitory computer-readable storage media collectively store all of the code. In at least one embodiment, executable instructions are executed such that different instructions are executed by different processors (for example, a non-transitory computer-readable storage medium stores instructions and a main central processing unit ("CPU") executes some of the instructions while a graphics processing unit ("GPU") and/or a data processing unit ("DPU"), potentially in conjunction with a GPU, executes other instructions). In at least one embodiment, different components of a computer system have separate processors and different processors execute different subsets of instructions.

Accordingly, in at least one embodiment, computer systems are configured to implement one or more services that singly or collectively perform operations of processes described herein and such computer systems are configured with applicable hardware and/or software that enable the performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of the disclosure, and does not pose a limitation on the scope of the disclosure unless otherwise claimed. No language in the specification should be construed as indicating any non-claimed element as essential to the practice of the disclosure.

All references, including publications, patent applications, and patents, cited herein are hereby incorporated by reference to the same extent as if each reference were individually and specifically indicated to be incorporated by reference and were set forth in its entirety herein.

In the description and claims, the terms "coupled" and "connected," along with their derivatives, may be used. It should be understood that these terms may not be intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still cooperate or interact with each other.

Unless specifically stated otherwise, it may be appreciated that throughout the specification, terms such as "processing," "computing," "calculating," "determining," or the like, refer to the action and/or processes of a computer or computing system, or a similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

In a similar manner, the term "processor" may refer to any device or portion of a device that processes electronic data from registers and/or memory and transform that electronic data into other electronic data that may be stored in registers and/or memory. As non-limiting examples, a "processor" may be a CPU or a GPU. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously, or intermittently. In at least one embodiment, terms "system" and "method" are used herein interchangeably insofar as a system may embody one or more methods and methods may be considered a system.

In the present document, references may be made to obtaining, acquiring, receiving, or inputting analog or digital data into a subsystem, computer system, or computer-implemented machine. In at least one embodiment, the process of obtaining, acquiring, receiving, or inputting analog and digital data can be accomplished in a variety of ways such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface or an interprocess communication mechanism.

Although descriptions herein set forth example embodiments of described techniques, other architectures may be used to implement described functionality, and are intended to be within the scope of this disclosure. Furthermore, although specific distributions of responsibilities may be defined above for purposes of description, various functions and responsibilities might be distributed and divided in different ways, depending on circumstances.

Furthermore, although the subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A voltage regulator (VR) circuit comprising:

a set of N output rails, where N is a positive integer greater than one;

a set of N VR controllers;

a set of M phases, where M is a positive integer greater than one, wherein each phase of the set of M phases comprises i) power components to regulate an output voltage and provide an output current, and ii) an N:1 input multiplexer to selectively couple the respective phase of the set of M phases to one of the set of N VR controllers;

an output switch matrix coupled to the set of M phases and the set of N output rails; and supervisor logic coupled to the output switch matrix, the set of M phases, and the set of N VR controllers, wherein the supervisor logic is to selectively couple any one or more phases of the set of M phases to any one or more output rails of the set of N output rails.

2. The VR circuit of claim 1, wherein the supervisor logic, at a first time, is to:

control one or more of the N:1 input multiplexers to couple a first VR controller of the set of N VR controllers to a first subset of one or more phases of the set of M phases according to a first phase allocation for a first output rail of the set of N output rails; and control the output switch matrix to couple the first subset to the first output rail according to the first phase allocation.

3. The VR circuit of claim 2, wherein the supervisor logic, at the first time, is further to:

control one or more of the N:1 input multiplexers to couple a second VR controller of the set of N VR controllers to a second subset of one or more phases of the set of M phases according to a second phase allocation for a second output rail of the set of N output rails; and control the output switch matrix to couple the second subset to the second output rail according to the second phase allocation.

4. The VR circuit of claim 2, wherein the supervisor logic, at a second time after the first time, is further to:

control one or more of the N:1 input multiplexers to couple the first VR controller to a second subset of one or more phases of the set of M phases according to a second phase allocation for the first output rail, wherein the first subset and the second subset are different; and control the output switch matrix to couple the second subset to the first output rail according to the second phase allocation.

5. The VR circuit of claim 1, wherein the supervisor logic is to:

track an availability status of each of the set of M phases;

track a current phase allocation for each of the set of N VR controllers; and track a total output current provided by each of the set of N output rails or an output current provided by each of the set of M phases.

6. The VR circuit of claim 1, wherein:

a first VR controller of the set of N VR controllers is to allocate, at a first time, a first subset of one or more phases of the set of M phases; and the first VR controller is to allocate, at a second time after the first time, a second subset of one or more phases of the set of M phases, wherein the first subset and the second subset are different.

7. The VR circuit of claim 1, wherein:

a first VR controller of the set of N VR controllers is to allocate, at a first time, a first subset of one or more phases of the set of M phases; and a second VR controller of the set of N VR controllers is to allocate, at a second time after the first time, a second subset of one or more phases of the set of M phases.

8. The VR circuit of claim 1, wherein the VR circuit is an integrated circuit comprising the set of N output rails, the set of N VR controllers, the set of M phases, the output switch matrix, and the supervisor logic, and wherein the set of M phases are re-allocatable.

9. The VR circuit of claim 1, further comprising a first integrated circuit and a second integrated circuit, wherein the first integrated circuit comprises at least the set of N VR controllers and the set of M phases, and wherein the second integrated circuit comprises at least the output switch matrix.

10. The VR circuit of claim 1, further comprising a control bus coupled to a system controller, wherein the system controller comprises the supervisor logic.

11. The VR circuit of claim 1, further comprising:

a second set of VR controllers;

a second output switch matrix;

a second set of phases, each phase of the second set of phases to provide an output current, wherein the second set of phases is coupled to the second output switch matrix; and second supervisor logic coupled to the second output switch matrix, the second set of phases, and the second set of VR controllers, wherein the second supervisor logic is to selectively couple any one or more phases of the second set of phases to any one or more output rails of the set of N output rails.

12. A system comprising:

a plurality of circuits; and a multi-phase voltage regulator (VR) module comprising a plurality of output rails, each of which is coupled to one of the plurality of circuits, wherein the multi-phase VR module further comprises:

a plurality of VR controllers;

a plurality of phases;

an output switch matrix; and phase allocation logic coupled to the plurality of VR controllers, the plurality of phases, and the output switch matrix, wherein the phase allocation logic is to selectively allocate, using the output switch matrix, any combination of the plurality of phases to one of the plurality of VR controllers to provide an output power on one of the plurality of output rails.

13. The system of claim 12, wherein each of the plurality of phases comprises an input multiplexer coupled to each of the plurality of VR controllers, wherein the phase allocation logic is to:

at a first time, control one or more of the input multiplexers to couple a first combination of the plurality of phases to a first VR controller of the plurality of VR controllers;

at the first time, control the output switch matrix to couple the first combination of the plurality of phases to a first output rail of the plurality of output rails;

at a second time, control one or more of the input multiplexers to couple a second combination of the plurality of phases to the first VR controller; and at the second time, control the output switch matrix to couple the second combination of the plurality of phases to the first output rail.

14. The system of claim 13, wherein the phase allocation logic is to:

at a third time, control one or more of the input multiplexers to couple a third combination of the plurality of phases to a second VR controller of the plurality of VR controllers, wherein at least one of the plurality of phases is common to the first combination and the third combination; and at the third time, control the output switch matrix to couple the third combination to a second output rail.

15. The system of claim 12, wherein a first VR controller of the plurality of VR controllers is a multi-phase buck controller.

16. The system of claim 12, wherein the phase allocation logic is to:

track an availability status of each of the plurality of phases;

track a current phase allocation for each of the plurality of VR controllers; and track a total output current provided by each of the plurality of output rails or an output current provided by each of the plurality of phases.

17. The system of claim 12, further comprising:

a second multi-phase VR module coupled to the plurality of output rails; and a system controller coupled to the multi-phase VR module and the second multi-phase VR module, wherein the system controller is to control the multi-phase VR module and the second multi-phase VR module to provide a combined output power to the plurality of circuits.

18. The system of claim 12, wherein each phase of the plurality of phases comprises:

an input multiplexer to selectively couple to one of the plurality of VR controllers; and power components to provide a portion of an output current on one of the plurality of output rails via the output switch matrix.

19. The system of claim 12, wherein the plurality of circuits comprises at least one of a processor core of a central processing unit (CPU), a core of a graphics processing unit (GPU), a core of a data processing unit (DPU), an input/output (I/O) block, or a deep learning accelerator (DLA).

20. A method of operating supervisor logic, the method comprising:

receiving, by the supervisor logic from a first voltage regulator (VR) controller, a first request associated with a first phase allocation for a first output rail;

identifying, by the supervisor logic, a first subset of one or more phases from a plurality of phases to allocate to the first output rail for the first phase allocation;

controlling, by the supervisor logic, an input multiplexer of each phase of the first subset to couple to the first VR controller according to the first phase allocation; and controlling, by the supervisor logic, an output switch matrix to couple the first subset to the first output rail according to the first phase allocation.

21. The method of claim 20, further comprising:

receiving, by the supervisor logic from the first VR controller, a second request associated with a second phase allocation for the first output rail;

identifying, by the supervisor logic, a second subset of one or more phases from the plurality of phases to allocate to the first output rail for the second phase allocation;

controlling, by the supervisor logic, an input multiplexer of each phase of the second subset to couple to the first VR controller according to the second phase allocation; and controlling, by the supervisor logic, the output switch matrix to couple the second subset to the first output rail according to the second phase allocation.

22. The method of claim 20, further comprising:

receiving, by the supervisor logic from a second VR controller, a second request associated with a second phase allocation for a second output rail;

identifying, by the supervisor logic, a second subset of one or more phases from the plurality of phases to allocate to the second output rail for the second phase allocation;

controlling, by the supervisor logic, an input multiplexer of each phase of the second subset to couple to the second VR controller according to the second phase allocation; and controlling, by the supervisor logic, the output switch matrix to couple the second subset to the second output rail according to the second phase allocation.

* * * * *